(12) United States Patent
Kim et al.

(10) Patent No.: US 10,429,010 B2
(45) Date of Patent: Oct. 1, 2019

(54) DISPLAY DEVICE AND METHOD FOR MANUFACTURING THE SAME

(71) Applicant: SAMSUNG DISPLAY CO., LTD., Yongin-si, Gyeonggi-do (KR)

(72) Inventors: Jungkyun Kim, Seoul (KR); Hanmoe Cha, Seoul (KR); Donghoon Kim, Suwon-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/447,842

(22) Filed: Mar. 2, 2017

(65) Prior Publication Data

US 2018/0023771 A1  Jan. 25, 2018

(30) Foreign Application Priority Data

Jul. 21, 2016 (KR) .................. 10-2016-0092744

(51) Int. Cl.
*F21K 9/64* (2016.01)
*F21V 9/30* (2018.01)
(Continued)

(52) U.S. Cl.
CPC .................. *F21K 9/64* (2016.08); *F21K 9/90* (2013.01); *F21V 3/02* (2013.01); *F21V 9/30* (2018.02);
(Continued)

(58) Field of Classification Search
CPC .......... F21K 9/64; G02F 2001/133614; G02F 1/133617
(Continued)

(56) References Cited

U.S. PATENT DOCUMENTS 9,803,809 B2 * 10/2017 Hikmet .................. C09K 11/06
2003/0189829 A1 * 10/2003 Shimizu .................... F21L 4/00
362/240

(Continued)

FOREIGN PATENT DOCUMENTS

EP 3045963 A2 7/2016
JP 2011-155187 A 8/2011
(Continued)

OTHER PUBLICATIONS

L. Wang, Highly efficient narrow-band green and red phosphors enabling wider color-gamut LEDbacklight for more brilliant displays, Oct. 23, 2015, vol. 23, DOI:10.1364/OE.23.028707, Optics Express 28707.*

*Primary Examiner* — Sean P Gramling
*Assistant Examiner* — Keith G. Delahoussaye
(74) *Attorney, Agent, or Firm* — Kile Park Reed & Houtteman PLLC

(57) ABSTRACT

A display device includes an organic fluorescent body unit and a display panel provided on the organic fluorescent body unit. The organic fluorescent body unit may include a light source unit including a light source substrate and a plurality of light sources on the light source substrate, a red organic fluorescent body layer covering the light sources and including a red organic fluorescent body, and a green organic fluorescent body layer provided on the red organic fluorescent body layer and including a green organic fluorescent body. The red organic fluorescent body layer may include a plurality of red organic fluorescent body patterns, each of which respectively covers one of the light sources.

18 Claims, 12 Drawing Sheets

(51) Int. Cl.
*F21K 9/90* (2016.01)
*F21V 3/02* (2006.01)
*G02F 1/1335* (2006.01)
*H01L 33/50* (2010.01)

(52) U.S. Cl.
CPC .. *G02F 1/133603* (2013.01); *G02F 1/133606* (2013.01); *G02F 1/133608* (2013.01); *G02F 1/133611* (2013.01); *H01L 33/504* (2013.01); *G02F 2001/133614* (2013.01)

(58) Field of Classification Search
USPC .......................................................... 362/84
See application file for complete search history.

(56) References Cited

U.S. PATENT DOCUMENTS

| | | | |
|---|---|---|---|
| 2007/0090755 A1 | 4/2007 | Eida et al. | |
| 2007/0228932 A1* | 10/2007 | Amano | C09K 11/06 313/502 |
| 2011/0002140 A1* | 1/2011 | Tsukahara | G02B 5/0236 362/602 |
| 2011/0228514 A1* | 9/2011 | Tong | H01L 25/0753 362/84 |
| 2013/0070448 A1* | 3/2013 | Galvez | F21K 9/62 362/230 |
| 2014/0098544 A1* | 4/2014 | Shin | H05K 3/0052 362/308 |
| 2015/0176773 A1* | 6/2015 | Yamamoto | G02F 1/133606 362/97.3 |
| 2015/0378217 A1 | 12/2015 | Kim et al. | |
| 2016/0077273 A1 | 3/2016 | Kim et al. | |
| 2016/0097495 A1* | 4/2016 | Yamamoto | G02B 6/0073 349/65 |
| 2017/0123317 A1* | 5/2017 | Kamura | G03F 7/039 |
| 2017/0322452 A1 | 11/2017 | Lee et al. | |

FOREIGN PATENT DOCUMENTS

| | | |
|---|---|---|
| JP | 2012-054607 A | 3/2012 |
| JP | 2012-134406 A | 7/2012 |
| JP | 2014-135400 A | 7/2014 |
| KR | 10-2008-0045338 A | 5/2008 |
| KR | 10-1478472 B1 | 12/2014 |
| KR | 10-2017-0126068 A | 11/2017 |

* cited by examiner

DISPLAY DEVICE AND METHOD FOR MANUFACTURING THE SAME

CROSS-REFERENCE TO RELATED APPLICATION

Korean Patent Application No. 10-2016-0092744, filed on Jul. 21, 2016, in the Korean Intellectual Property Office, and entitled: "Display Device and Method for Manufacturing the Same," is incorporated by reference herein in its entirety.

BACKGROUND

1. Field

Embodiments relate to a display device and a method for manufacturing the same.

2. Description of the Related Art

Display devices include liquid crystal display devices, plasma display devices, organic electroluminescent display devices, electroluminescent display devices, electrophoretic display devices, and the like. A display, for example, a liquid crystal display device, may not be self-illuminating and thus may have a light receiving and emitting type element that uses a separate light source.

SUMMARY

Embodiments are directed to a display device including an organic fluorescent body unit and a display panel provided on the organic fluorescent body unit. The organic fluorescent body unit may include a light source unit including a light source substrate and a plurality of light sources on the light source substrate, a red organic fluorescent body layer covering the light sources and including a red organic fluorescent body, and a green organic fluorescent body layer provided on the red organic fluorescent body layer and including a green organic fluorescent body. The red organic fluorescent body layer may include a plurality of red organic fluorescent body patterns, each of which respectively covers one of the light sources.

On a plane, the red organic fluorescent body patterns may overlap a portion of the light source substrate.

On a plane, the red organic fluorescent body patterns may be spaced apart from each other.

The organic fluorescent body unit may further include a base member in which are defined fluorescent body grooves. The base member may be provided between the light source substrate and the green organic fluorescent body layer. Each of the red organic fluorescent body patterns may be respectively accommodated in one of the fluorescent body grooves.

The fluorescent body grooves may be provided on the bottom face of the base member.

The bottom face of the base member may contact the light source substrate and the red organic fluorescent body patterns, and the top face of the base member may contact the green organic fluorescent body layer.

The green organic fluorescent body layer may be spaced apart from the light source substrate and provided over the entirety of the light source substrate.

The red organic fluorescent body layer may be provided over the entirety of the light source substrate and cover the light sources.

The display device may further include an optical sheet provided between the organic fluorescent body unit and the display panel.

The display device may further include a diffusion plate provided between the organic fluorescent body unit and the optical sheet.

A face of the green organic fluorescent body layer may be exposed to air.

The red organic fluorescent body may be a perylene-based compound and the green organic fluorescent body may be a boron-dipyrromethene-based compound.

Light generated by the green organic fluorescent body may have a full width at half maximum that is smaller than the full width at half maximum of light generated by the red organic fluorescent body.

The glass transition temperature of the green organic fluorescent body may be lower than the glass transition temperature of the red organic fluorescent body.

Embodiments are also directed to a method for manufacturing a display device, the method including providing an organic fluorescent body unit and providing a display panel on the organic fluorescent body unit. The providing of the organic fluorescent body unit may include preparing a base substrate and a plurality of light sources provided on the base substrate, providing a red organic fluorescent body layer including a plurality of organic fluorescent body patterns, each of which respectively covers one of the light sources, and providing a green organic fluorescent body layer on the red organic fluorescent body layer.

The method may further include forming injection holes in the base substrate, and providing the light sources on the base substrate.

In the providing of the light sources, each of the light sources may be provided spaced apart on a plane from the injection holes.

The method may further include providing a base member in which are defined fluorescent body grooves, each of which respectively accommodates one of the light sources. The providing of the red organic fluorescent body layer may include injecting the red organic fluorescent body and a first resin into the injection holes to fill the fluorescent body grooves.

The method may further include sealing the injection holes after the providing of the red organic fluorescent body layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
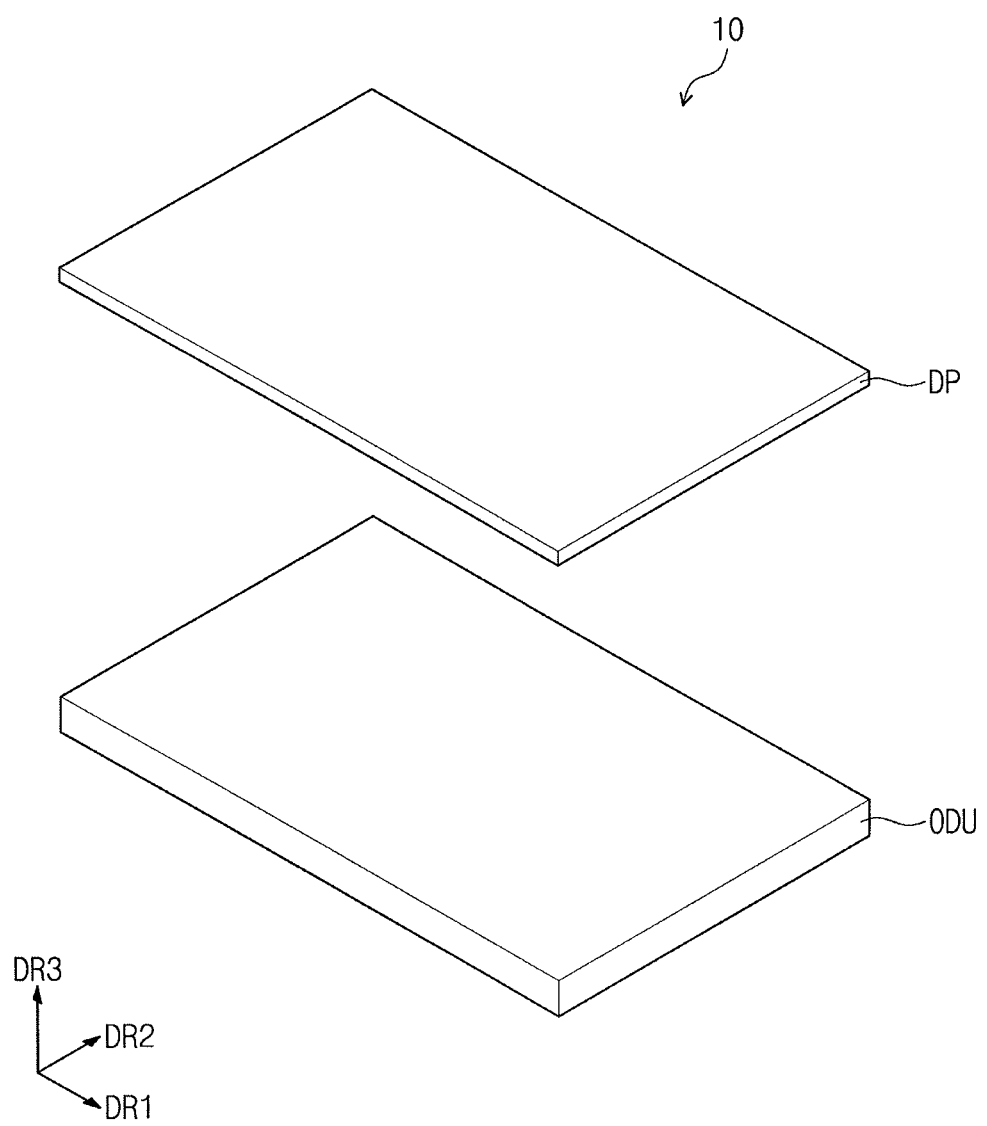
FIGS. 1A to 1C illustrate exploded perspective views schematically illustrating a display device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. Like reference numerals refer to like elements throughout.

It will be understood that, although the terms first, second, etc. may be used herein to describe various elements, these elements, should not be limited by these terms. These terms are only used to distinguish one element from another element. Thus, without departing from the teachings of the present invention, a first element below could be termed a second element, and similarly, a second element could be termed a first element. As used herein, singular forms are intended to include the plural forms as well, unless the context clearly indicates otherwise.

It will be further understood that the terms "includes" and/or "including", when used in this specification, specify the presence of stated features, integers, steps, operations, elements, components, or combinations thereof, but do not preclude the presence or addition of one or more other features, integers, steps, operations, elements, components, or combinations thereof. Moreover, it will also be understood that when an element such as a layer, film, area, plate, etc. is referred to as being 'on' another element, it can be directly on the other element, or intervening elements may also be present. Further, it will be understood that when an element such as a layer, film, area, plate, etc. is referred to as being 'under' another element, it can be directly under, and one or more intervening elements may also be present.

Figure 1B:
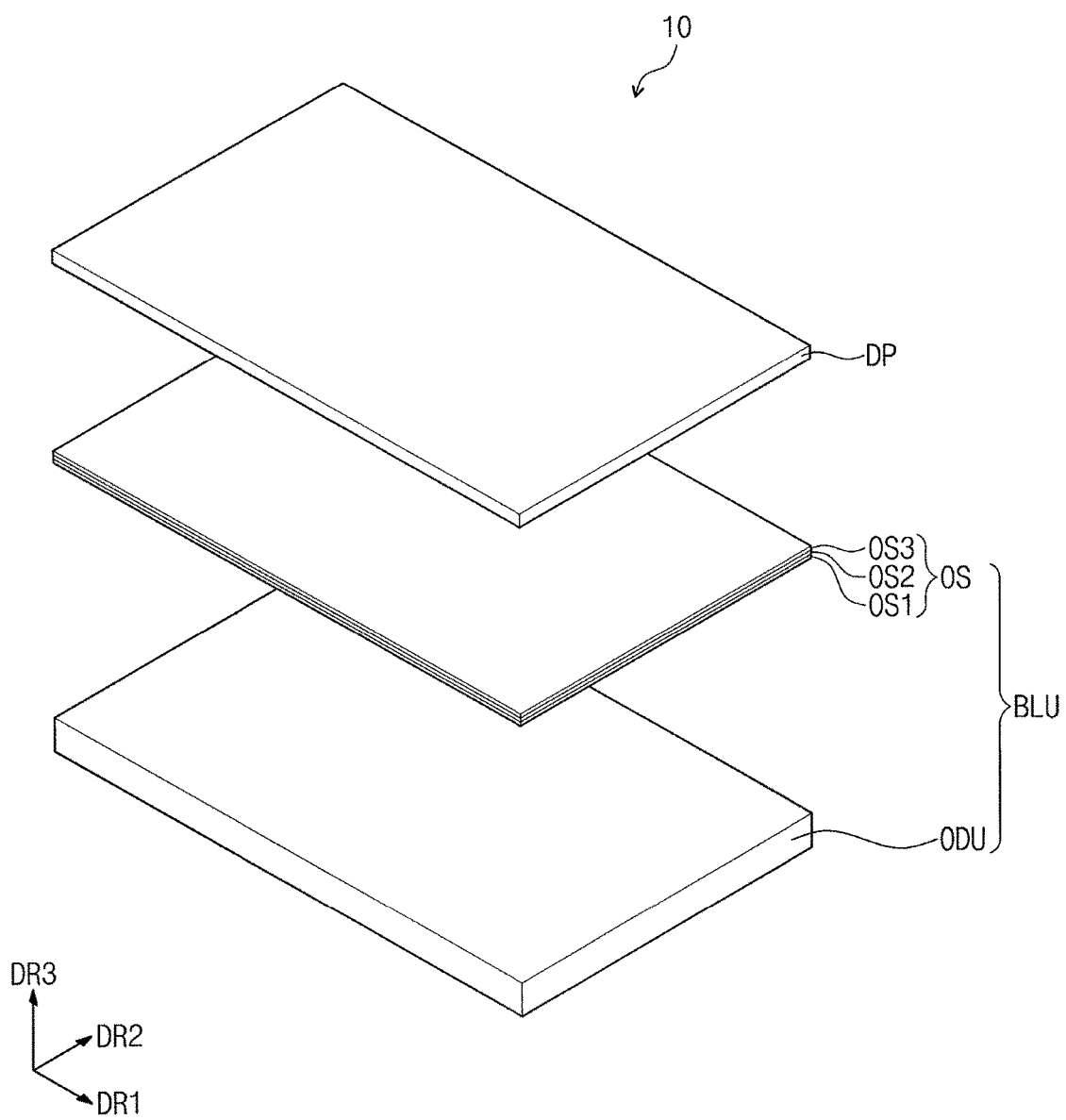
Figure 1C:
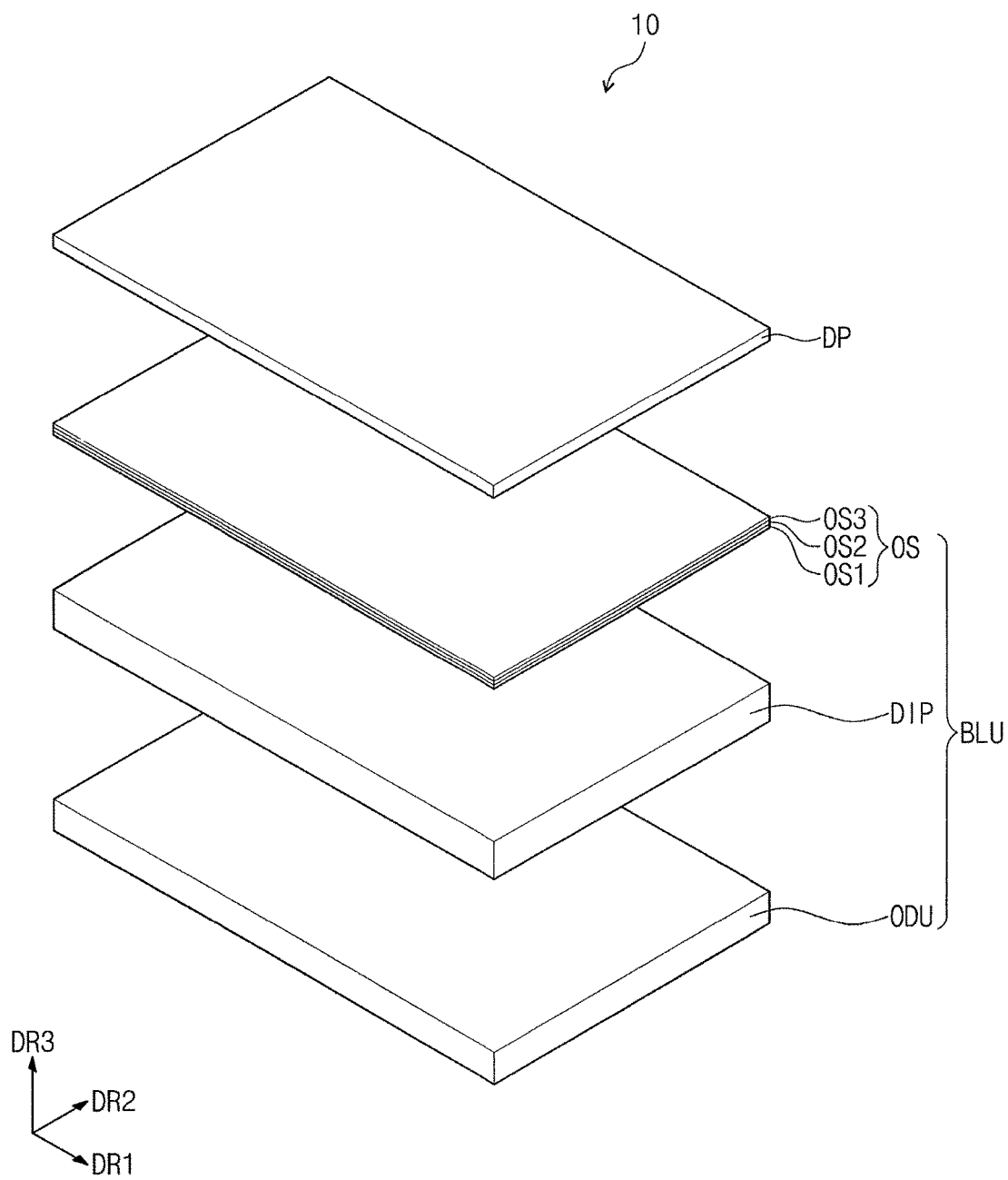

FIGS. 1A to 1C are exploded perspective views schematically illustrating a display device according to an example embodiment.

Referring to FIGS. 1A to 1C, a display device 10 according to an example embodiment includes a backlight unit BLU and a display panel DP provided on the backlight unit BLU. The backlight unit BLU may be disposed on a plane defined by a first direction DR1 and a second direction DR2. The backlight unit BLU and the display panel DP may be laminated in a third direction DR3 intersecting each of the first direction DR1 and the second direction DR2.

The display panel DP is provided on the backlight unit BLU. The display panel DP is provided with light via the backlight unit BLU and displays an image that may be viewed at the surface opposite the backlight unit BLU. The display panel DP is a light receiving type display panel and may be a variety of panels, including a liquid crystal display panel, a plasma display panel, an electrophoretic display panel, a microelectromechanical system (MEMS) display panel, or an electrowetting display panel and the like. The display panel DP according to an example embodiment will be exemplarily described as a liquid crystal display panel.

The liquid display panel may be a panel in any one of a vertical alignment (VA) mode, a patterned vertical alignment (PVA) mode, an in-plane switching (IPS) mode or fringe-field switching (FFS) mode, or a plane to line switching (PLS) mode, etc., but is not limited to a panel in a particular mode.

In FIGS. 1A to 1C, the display panel DP is exemplarily illustrated as a direct type display panel, but the display panel DP is not limited thereto and may also be an edge type display panel.

The backlight unit BLU provides light to the display panel DP. The backlight unit BLU includes an organic fluorescent body unit ODU. The organic fluorescent body unit ODU includes a light source unit LU, a red organic fluorescent body layer (ODL1 in FIG. 2A), and a green organic fluorescent body layer (ODL2 in FIG. 2A). The light source unit LU provides a first light to the red organic fluorescent body layer (ODL1 in FIG. 2A). For example, the light source unit LU may provide a blue light. The light source unit LU may include a plurality of light sources (LS) and a light source substrate CB, which provides electrical power to the light sources LS and on which the light sources LS are disposed. The light sources LS may be, for example, light emitting diodes (LED). The light sources LS may be provided, spaced apart from each other in the second direction DR2, on the light source substrate CB. The light sources LS may provide, for example, a blue light. The organic fluorescent body unit ODU will be described later in greater detail.

Referring to FIGS. 1B and 1C, the backlight unit BLU may further include an optical sheet OS. The optical sheet OS may be provided between the organic fluorescent body unit ODU and the display panel DP. The optical sheet OS may enhance the brightness and/or the viewing angle, etc., of light provided to the display panel DP. The optical sheet OS may include, for example, a first optical sheet OS1, a second optical sheet OS2, and a third optical sheet OS3, which are sequentially laminated.

The first optical sheet OS1 may be a diffusion sheet which diffuses light provided to the display panel DP. The second optical sheet OS2 may be a prism sheet which focuses, in a direction perpendicular to the plane of the display panel DP above, light diffused at the diffusion sheet. The third optical sheet OS3 may be a protective sheet which protects the prism sheet from external impact. The optical sheet OS may be used by overlapping multiple sheets of at least one of the first optical sheet OS1, the second optical sheet OS2, or the third optical sheet OS3, and when necessary, one or more of the sheets may also be excluded.

Referring to FIG. 1C, the backlight unit BLU may further include a diffusion plate DIP. The diffusion plate DIP may be provided with light from the organic fluorescent body unit ODU and provide light to the display panel DP. The diffusion plate DIP may be provided between the organic fluorescent body unit ODU and the optical sheet OS.

The display device 10 according to an example embodiment may further include a bottom chassis. The bottom chassis may be formed below the backlight unit BLU. The bottom chassis may store the display panel DP and elements of the backlight unit BLU.

The display device 10 according to an example embodiment may further include a mold frame. The mold frame may be provided between the display panel DP and the backlight unit BLU. The mold frame may be provided along the edge of the display panel DP and support the display panel DP from below the display panel DP. The mold frame may be provided separate from the bottom chassis, and may also be integrated with the bottom chassis.

Figure 2A:
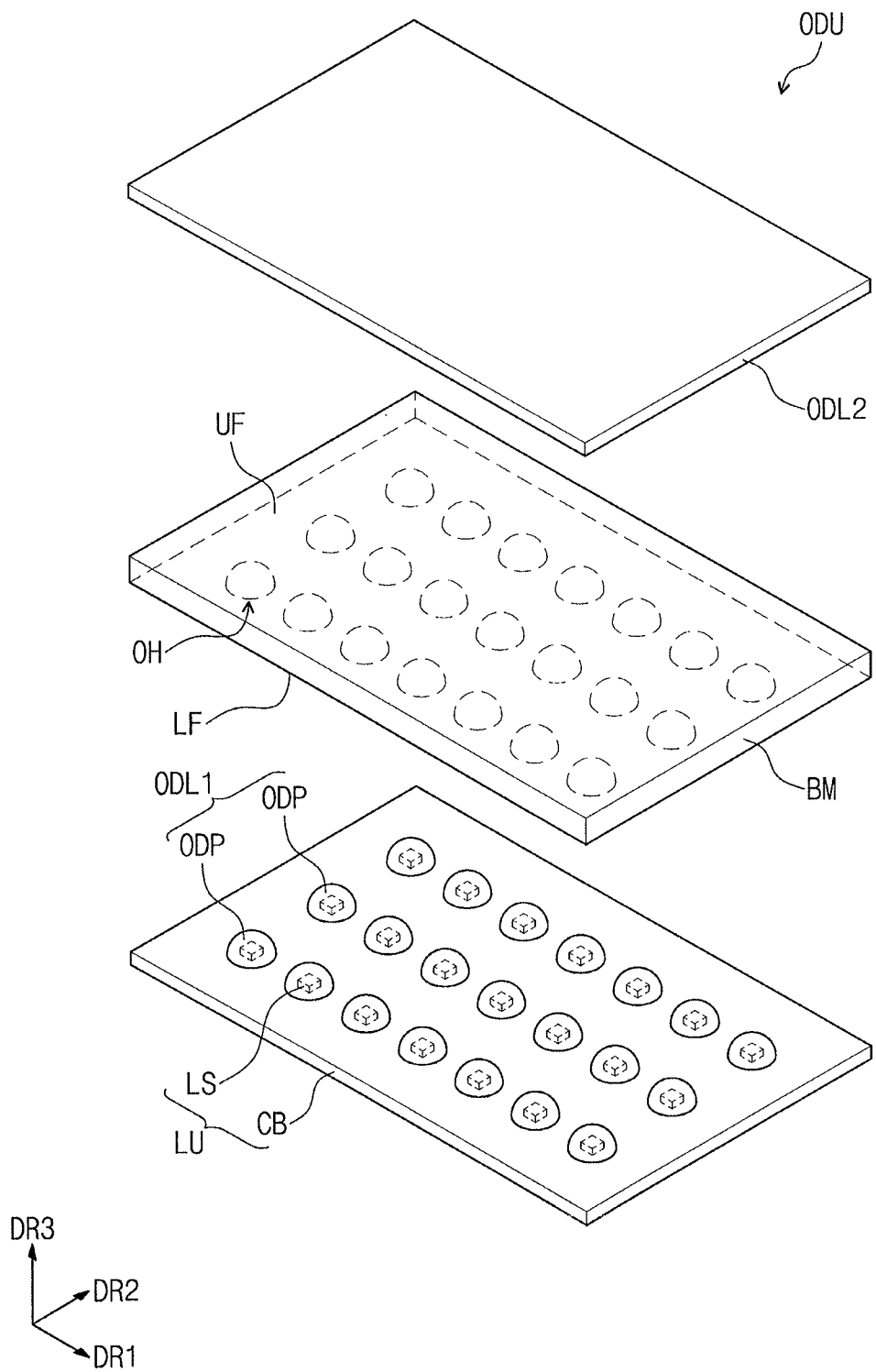
FIG. 2A illustrates an exploded schematic perspective view of an organic fluorescent body unit included in a display device according to an example embodiment.
Figure 2B:
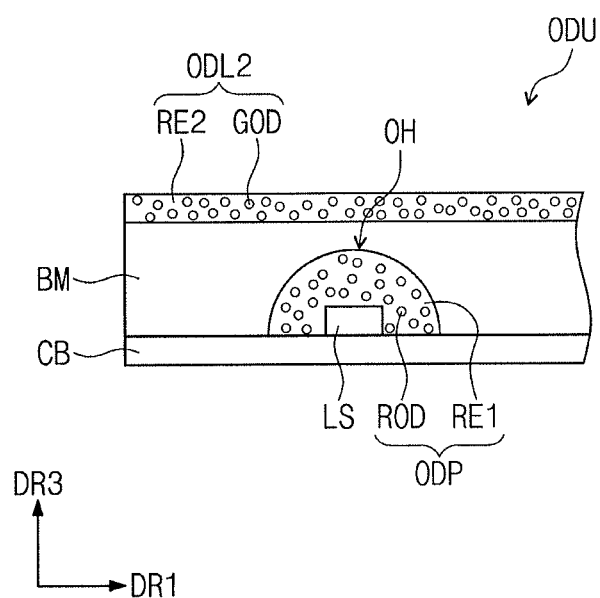
FIG. 2B illustrates a cross-sectional schematic view of an organic fluorescent body unit included in a display device according to an example embodiment.

FIG. 2A is an exploded perspective view schematically illustrating an organic fluorescent body unit included in a display device according to an example embodiment. FIG. 2B is a cross-sectional view schematically illustrating an organic fluorescent body unit included in a display device according to an example embodiment.

Figure 3A:
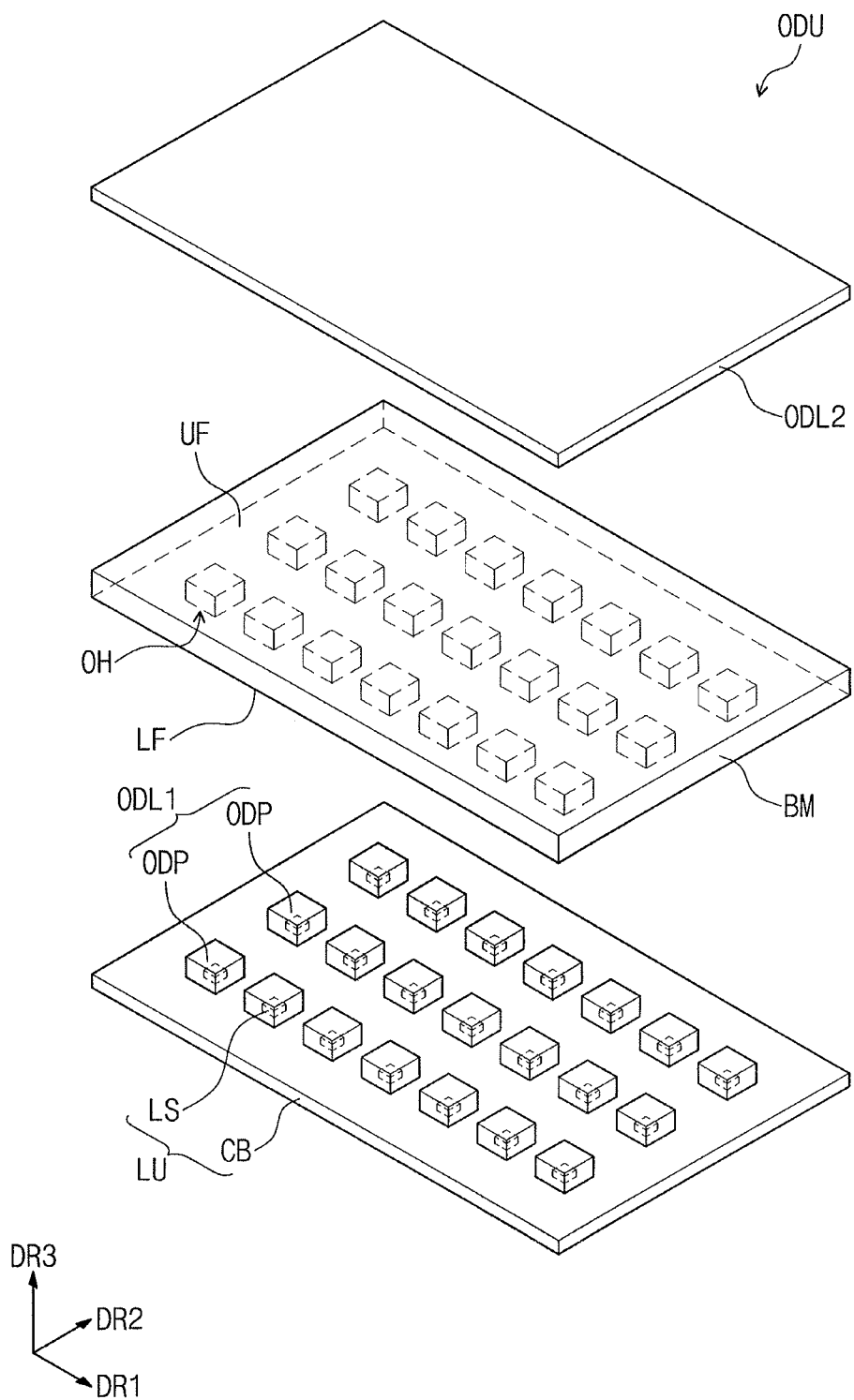
FIG. 3A illustrates an exploded schematic perspective view of an organic fluorescent body unit included in a display device according to an example embodiment.
Figure 3B:
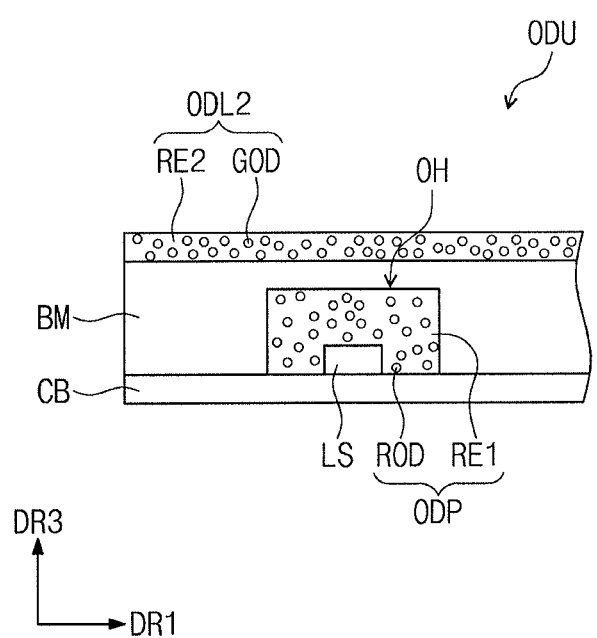
FIG. 3B illustrates a cross-sectional schematic view of an organic fluorescent body unit included in a display device according to an example embodiment.

FIG. 3A is an exploded perspective view schematically illustrating an organic fluorescent body unit included in a display device according to an example embodiment. FIG. 3B is a cross-sectional view schematically illustrating an organic fluorescent body unit included in a display device according to an example embodiment.

Figure 4A:
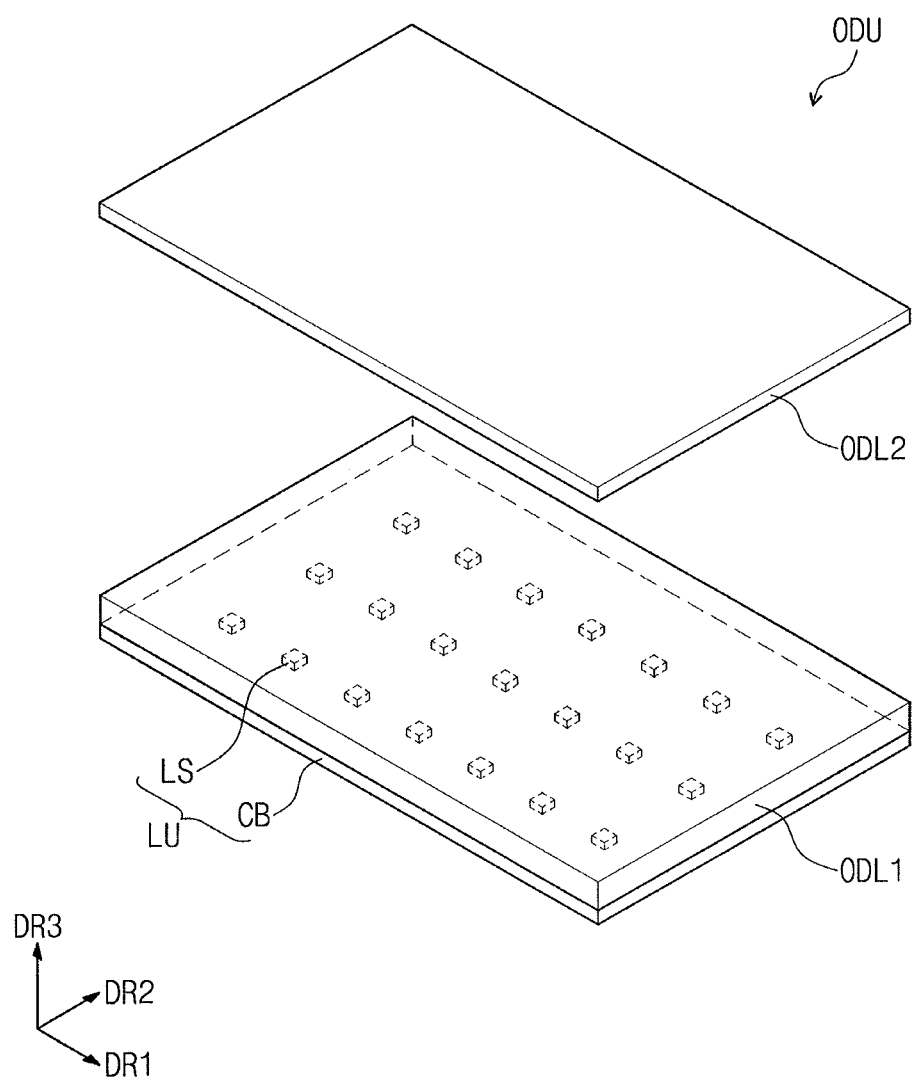
FIG. 4A illustrates an exploded schematic perspective view of an organic fluorescent body unit included in a display device according to an example embodiment.
Figure 4B:
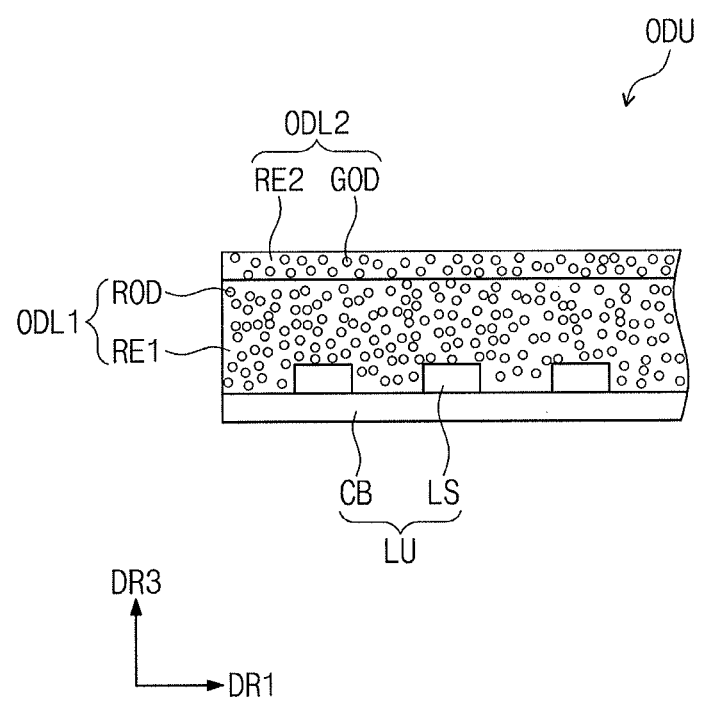
FIG. 4B illustrates a cross-sectional schematic view of an organic fluorescent body unit included in a display device according to an example embodiment.

FIG. 4A is an exploded perspective view schematically illustrating an organic fluorescent body unit included in a display device according to an example embodiment. FIG. 4B is a cross-sectional view schematically illustrating an organic fluorescent body unit included in a display device according to an example embodiment.

Referring to FIGS. 2A to 4B, as discussed above, the organic fluorescent body unit ODU includes the light source unit LU, the red organic fluorescent body layer ODL1, and the green organic fluorescent body layer ODL2. The light source unit LU includes the plurality of light sources LS and the light source substrate CB. The light source unit LU provides the first light, for example, blue light, to the red organic fluorescent body layer ODL1.

The red organic fluorescent layer ODL1 is provided with the first light and provides a second light to the green organic fluorescent body layer ODL2. For example, the red organic fluorescent body layer ODL1 may be provided with a blue light and provide a magenta light to the green organic fluorescent body layer ODL2.

The red organic fluorescent body layer ODL1 may a first resin RE1 and a red organic fluorescent body ROD. A first resin RE1 may be used without particular limit, and may include, for example, a silicon resin, a photosensitive resin, etc. The first resin RE1 may include, for example, at least one of a monomer or an oligomer. The first resin RE1 may be, for example, at least one of a polyester-based resin, a polyurethane-based resin, an acrylic-based resin, a vinyl-based resin, or a mixture thereof.

The red organic fluorescent body ROD indicates an organic material. The red organic fluorescent body ROD is provided with external light and generates light in the red visible light wavelength range, for example, about 620 nanometers (nm) to about 750 nanometers (nm). A red organic fluorescent body ROD may be used without particular limit, and may be, for example, a perylene-based compound.

In the disclosure, "X-based compound" may indicate that "X" is included in the structure of the compound.

The red organic fluorescent body ROD may include, for example, the following compound.

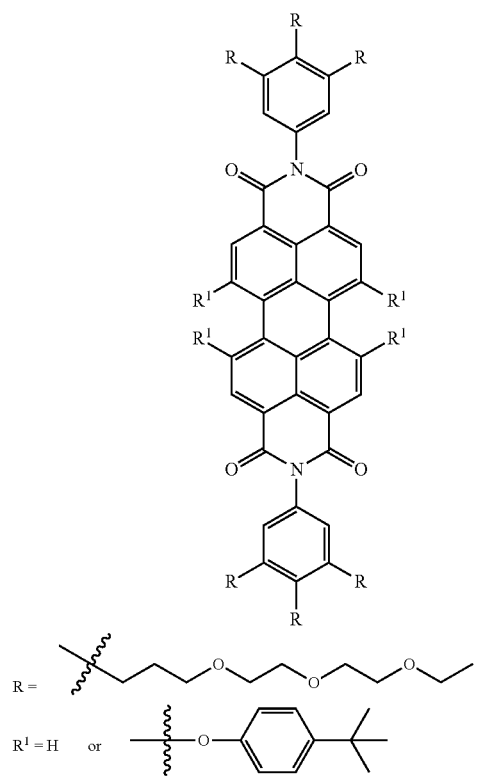

Referring to FIGS. 2A to 3B, the red organic fluorescent body layer ODL1 includes a plurality of red organic fluorescent body patterns ODP. The red organic fluorescent body patterns ODP may be spaced apart from each other in the first direction DR1 and the second direction DR2 and be arranged in a matrix. The red organic fluorescent body patterns ODP may be spaced apart from each other on a plane. In the present example embodiment, each of the red organic fluorescent body patterns ODP respectively covers one of the light sources LS.

In the present example embodiment, the red organic fluorescent body patterns ODP are provided on the light source substrate CB and the light sources LS. On a plane, the red organic fluorescent body patterns ODP may overlap a portion of the light source substrate CB. Each of the red organic fluorescent body patterns ODP is respectively accommodated in one of fluorescent body grooves OH described below.

Each of the red organic fluorescent body patterns ODP may have a variety of forms. For example, referring to FIGS. 2A and 2B, each of the red organic fluorescent body patterns ODP may have a dome-shaped appearance. The top face of each of the red organic fluorescent body patterns ODP may have a circular or elliptical cross section. For example, referring to FIGS. 3A and 3B, each of the red organic fluorescent body patterns ODP may have a hexahedron-shaped appearance. The top shape of each of the organic fluorescent body patterns ODP may have a polygonal cross section.

Referring to FIGS. 4A and 4B, the red organic fluorescent body layer ODL1 may be provided over the entirety of the light source substrate CB and cover the light sources LS. Thus, the red organic fluorescent body layer ODL1 may not include a plurality of patterns and instead be formed as a single integrated layer.

The physical properties of the red organic fluorescent body ROD are not lost, even when the red organic fluorescent body ROD is exposed to the air. Accordingly, at least a face of the red organic fluorescent body ODL1 may be exposed to the air. The organic fluorescent body unit ODU illustrated in FIGS. 4A and 4B may be used, for example, in a display device that utilizes high dynamic range (HDR) local dimming.

Referring again to FIGS. 2A to 4B, the green organic fluorescent body layer ODL2 is provided with the second light and provides a third light to the display panel DP. In the present example embodiment, the green organic fluorescent body layer ODL2 is provided on the red organic fluorescent body layer ODL1. The green organic fluorescent body layer ODL2 may be spaced apart from the light source substrate CB and provided over the entirety of the light source substrate CB. The green organic fluorescent body layer ODL2 may not include a plurality of patterns and instead be formed as a single integrated layer.

In the present example embodiment, the green organic fluorescent body layer ODL2 is provided with the second light and provides the third light to the display panel DP. For example, the green organic fluorescent body layer ODL2 may be provided with a magenta light and provide a white light to the display panel DP.

The green organic fluorescent body ODL2 may include a second resin RE2 and a green organic fluorescent body GOD. A second resin RE2 may be used without particular limit, and may include, for example, a silicon resin or a photosensitive resin. The second resin RE2 may include at least one of a monomer or an oligomer. The second resin RE2 may be, for example, at least one of a polyester-based resin, a polyurethane-based resin, an acrylic-based resin, a vinyl-based resin, or a mixture thereof.

The green organic fluorescent body GOD indicates an organic material that is provided with external light and generates light in the green visible wavelength range, for example, about 495 nanometers (nm) to about 570 nanometers (nm). A green organic fluorescent body GOD may be used without particular limit, and may be, for example, a boron-dipyrromethene (BODIPY)-based compound. A boron-dipyrromethene (BODIPY)-based compound may be used without limit, and may be, for example, selected from Compound Group 1 below.

[Compound Group 1]

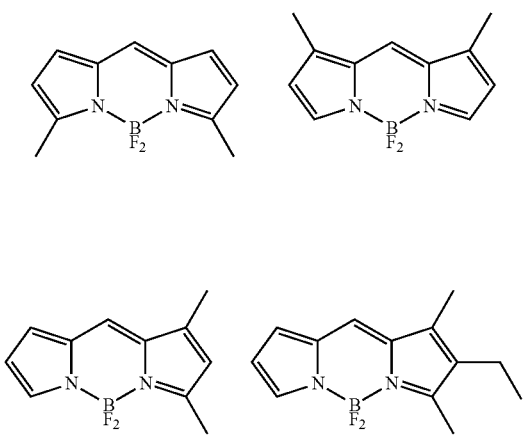

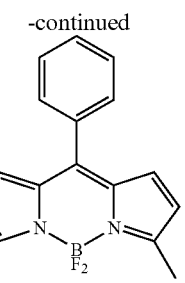

The physical properties of the green organic fluorescent body GOD are not lost, even when the green fluorescent body GOD is exposed to the air. Accordingly, at least a face of the green organic fluorescent body ODL2 may be exposed to the air.

The full width at half maximum of the light generated by the green organic fluorescent body GOD may be smaller than the full width at half maximum of the light generated by the red organic fluorescent body ROD. When the full width at half maximum of a generated light is small, the color reproducibility may be excellent. In an example embodiment, the green organic fluorescent body GOD has better color reproducibility than the red organic fluorescent body ROD.

The glass transition temperature of the green organic fluorescent body GOD may be lower than the glass transition temperature of the red organic fluorescent body ROD. When the glass transition temperature is low, the thermal stability may be low. In an example embodiment, the green organic fluorescent body GOD has lower thermal stability than the red organic fluorescent body ROD.

Referring to FIG. 2A to 3B, the organic fluorescent body unit ODU may further include a base member BM. The base member BM may be provided between the light source substrate CB and the green organic fluorescent body layer ODL2.

The base member BM may have a top face UF and a bottom face LF, the bottom face LF of the base member BM may contact the red organic fluorescent body layer ODL1, and the bottom face LF of the base member BM may contact the light source substrate CB.

A plurality of the fluorescent body grooves OH may be defined in the bottom face LF of the base member BM. The fluorescent body grooves OH may be depressed, from the bottom face LF of the base member BM, into the base member BM. One of the light source and one of the red organic fluorescent pattern may be accommodated in each of the fluorescent body grooves OH.

The top face UF of the base member BM may not be provided with the fluorescent body grooves OH. The top face UF of the base member BM may contact the green organic fluorescent body layer ODL2. The fluorescent body grooves OH may be provided on the bottom face LF of the base member BM.

The base member BM may be transparent. "Transparent" may indicate, for example, an optical transmittance of at least 80 percent. The base member BM may include, for example, a silicone or polymer resin. The polymer resin may be a transparent polymer, for example, polycarbonate, polymethylmethacrylate, polydimethylsiloxane, polystyrene, methacrylate styrene, etc.

In a display device, in a body unit including quantum dots or quantum rods (which are, for example, a semiconductor material), layers containing the quantum dots and layers containing the quantum rods may need to be prevented from exposure to the air. Quantum dots and quantum rods may lose electrons by bonding with the oxygen in the air. When quantum dots or quantum rods are included, it may not be straightforward to perform a lamination process with a separate barrier film. In addition, quantum dots that include heavy metals such as cadmium (Cd) and the like are carcinogens and thus may be harmful to the human body.

In an example embodiment, organic fluorescent bodies are used instead of quantum dots, and thus the reliability of the display device may be maintained even when a portion of the organic fluorescent body layer is exposed. Furthermore, since a display device according to an example embodiment may not be formed with heavy metals such as Cd and the like, effects (such as that of causing cancer) on the human body may be minimized in the process of using or manufacturing the display device.

A green organic fluorescent body may have low thermal stability, and thus may be deformed when disposed close to a light source. A red organic fluorescent body may have a high thermal stability and thus may not be deformed even when close to a light source. The full width at half maximum of green organic fluorescent bodies may be smaller than the full width at half maximum of red organic fluorescent bodies, and thus green organic fluorescent bodies may have excellent color reproduction. However, it may be difficult to maintain color reproduction in a display device when deformation occurs in a green organic fluorescent body.

In the display device according to an example embodiment, the red organic fluorescent body is positioned near the light source, and the green organic fluorescent body is formed as a separate layer which is spaced apart from the red organic fluorescent body and the light source, and thus the green organic fluorescent body may be positioned further from the light source than the red organic fluorescent body. Consequently, the display device according to an example embodiment may use the advantages of thermal stability of the red organic fluorescent body while helping to protect the green organic fluorescent body, and may thus enhance the color reproduction of the red organic fluorescent body and the green organic fluorescent body. The display device according to an example embodiment may improve the display quality.

Hereinafter, a method for manufacturing a display device according to an example embodiment is described. Hereinafter, the description is focused on differences with the display device according to an example embodiment described above, and parts of the display device which are not described below follow the above-described display device according to an example embodiment.

Figure 5:
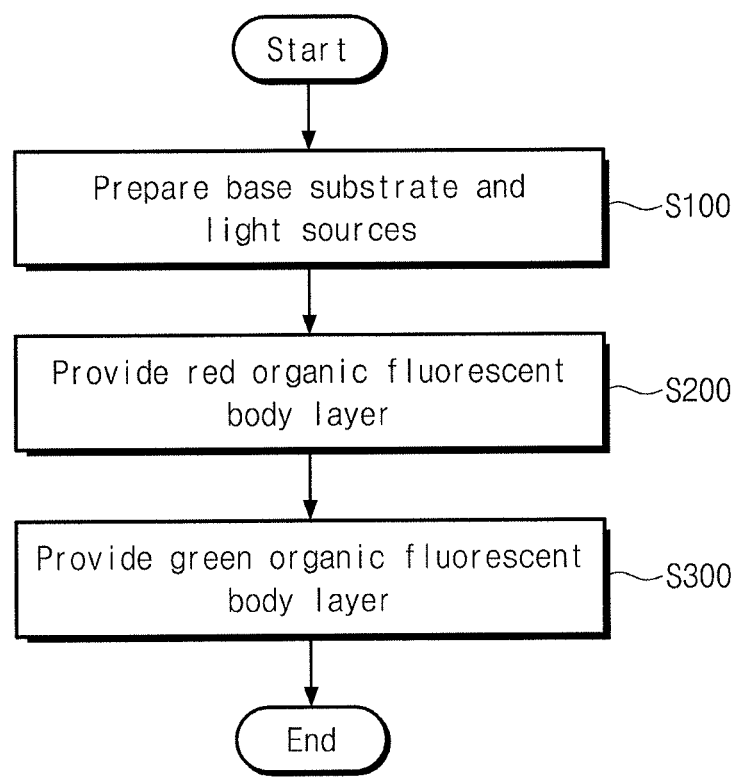
FIG. 5 illustrates a flow chart of a method for manufacturing a display device according to an example embodiment.

FIG. 5 is a flow chart of a method for manufacturing a display device according to an example embodiment. FIGS. 6A to 6G are cross-sectional views sequentially illustrating a method for manufacturing a display device according to an example embodiment. For convenience of description, in FIGS. 6B to 6G, only one of each of light sources LS, injection holes IH, red organic fluorescent body patterns ODP, and sealing parts SP are illustrated.

Referring to FIGS. 1A to 1C, 2A, 5, and 6A to 6G, a method for manufacturing a display device according to an example embodiment includes an operation for providing an organic fluorescent body unit ODU, and an operation for providing a display panel DP on the organic fluorescent body unit ODU. The operation for providing the organic fluorescent body unit ODU may include an operation S100 for preparing a base substrate BS and a plurality of light sources LS on the base substrate BS, an operation S200 for providing a red organic fluorescent body layer ODL1 covering the light sources LS, and an operation S300 for providing a green organic fluorescent body layer ODL2 on the red organic fluorescent body layer ODL1. The operation S200 for providing the red organic fluorescent body layer ODL1 is the operation S200 for providing the red organic fluorescent layer ODL1 including a plurality of red organic fluorescent body patterns ODP, each of which respectively covers one of the light sources LS.

Figure 6A:
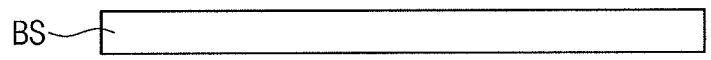
FIGS. 6A to 6G illustrate schematic cross-sectional views of stages in a method for manufacturing a display device according to an example embodiment.
Figure 6B:
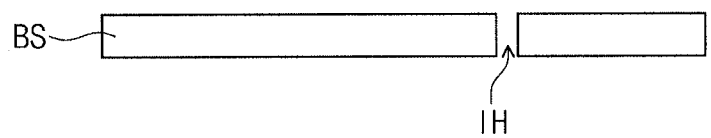
Figure 6C:
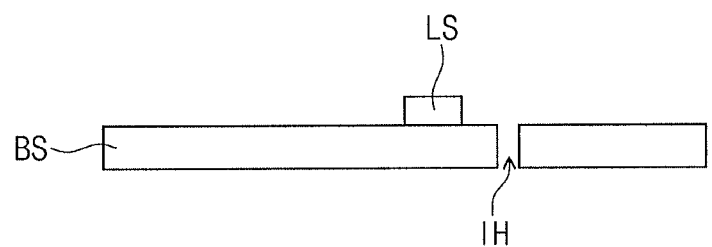

Referring to FIGS. 2A, 2B, 5, and 6A to 6C, the base substrate BS and the light sources LS are prepared S100. Referring to FIG. 6A, the base substrate BS is prepared. Referring to FIG. 6B, injection holes IH are formed in the base substrate BS. Referring to FIG. 6C, the light sources LS are provided on the base substrate BS. In the operation for providing the light sources LS, each of the light sources LS may be provided spaced apart on a plane from the injection holes IH.

Figure 6D:
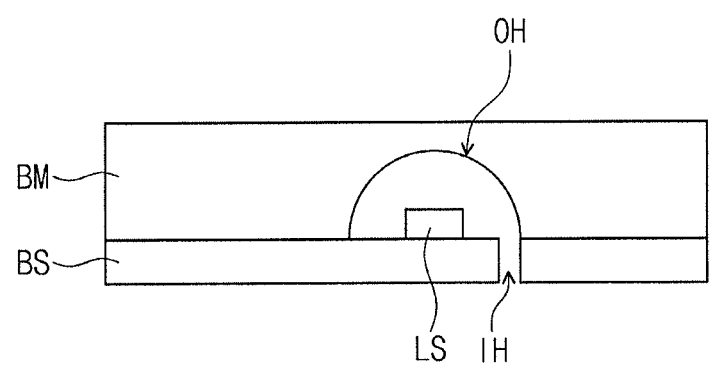
Figure 6E:
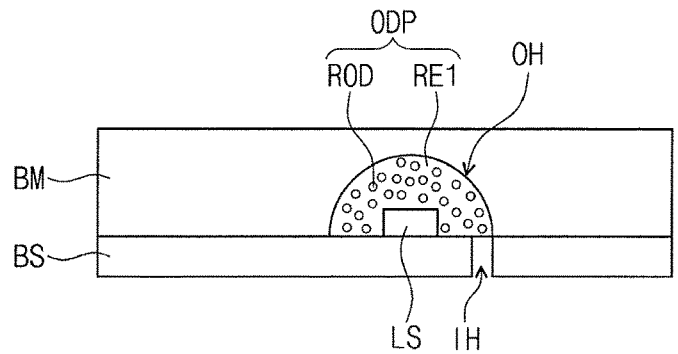

Referring to FIGS. 2A, 2B, and 6D, the method for manufacturing a display device according to an example embodiment may further include an operation for providing a base member BM. Fluorescent body grooves OH may be defined in the base member BM. The fluorescent body grooves OH may be provided on the bottom face of the base member BM. In the base member BM, each of the light sources LS may be respectively accommodated in one of the fluorescent body grooves (OH), and each of the fluorescent body grooves OH may be arranged (disposed) on the base substrate so as to respectively overlap one of the injection holes IH on a plane.

Referring to FIGS. 2A, 2B, 5, and 6E, the red organic fluorescent body layer ODL1 is provided S200. As described above, the red organic fluorescent body layer ODL1 includes the plurality of red organic fluorescent body patterns ODP. The red organic fluorescent body patterns ODP may be spaced apart from each other in a first direction DR1 and a second direction DR2 and be arranged in a matrix. The red organic fluorescent body patterns ODP may be spaced apart from each other on a plane. Each of the red organic fluorescent body patterns ODP may respectively cover one of the light sources LS.

The operation for providing the red organic fluorescent body layer ODL1 may include an operation for injecting a red organic fluorescent body ROD and a first resin RE1 into the injection holes IH to fill the fluorescent body grooves OH. When the fluorescent body grooves OH are filled with the red organic fluorescent body ROD and the first resin RE1, heat or light may be provided to cure the same.

Figure 6F:
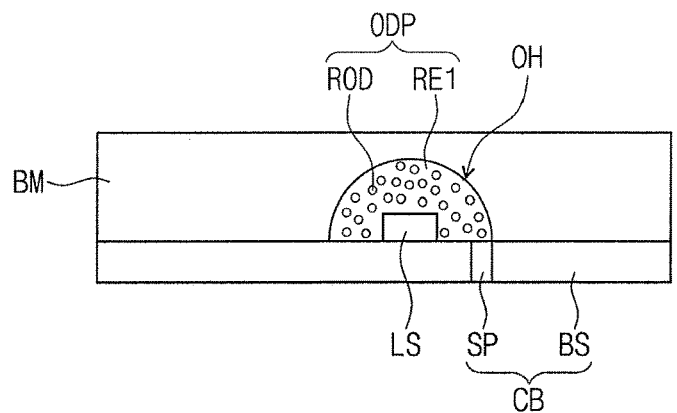

Referring to FIGS. 2A, 2B, and 6F, the method for manufacturing a display device according to an example embodiment may further include an operation for sealing the injection holes IH after the operation S200 for providing the red organic fluorescent body layer ODL1. Sealing parts SP may be formed by providing a sealant to the injection holes IH.

Figure 6G:
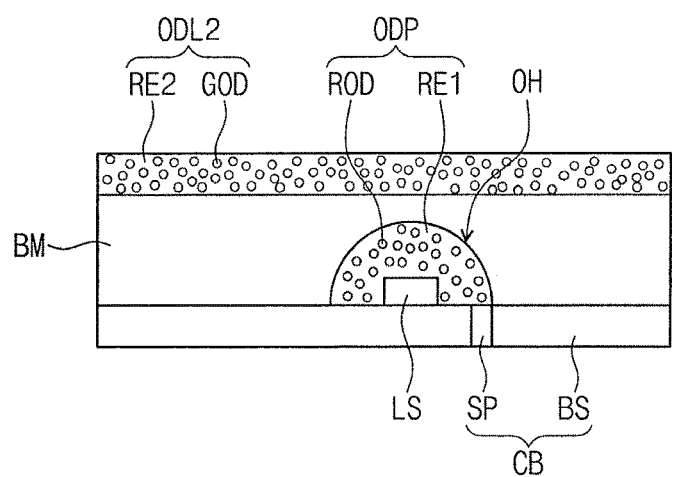

Referring to FIGS. 2A, 2B, and 6G, the green organic fluorescent body layer ODL2 is provided on the red organic fluorescent body layer ODL1 S300. The operation S300 for providing the green organic fluorescent layer ODL2 may include an operation for providing a green organic fluorescent body GOD and a second resin RE2, and an operation for curing the same.

In FIGS. 6A to 6G, a method for manufacturing the display device 10 including the organic fluorescent body unit ODU illustrated in FIGS. 2A and 2B was exemplarily illustrated. Other than the shape of the fluorescent body grooves OH, a method for manufacturing the display device 10 including the organic fluorescent body unit ODU illustrated in FIGS. 3A and 3B may be performed in the same way.

However, a method for manufacturing the display device 10 including the organic fluorescent body unit ODU illustrated in FIGS. 4A and 4B may be significantly different. Referring to FIGS. 6A to 6G, for example, in this case the base substrate BS may be a light source substrate CB. In addition, the operation for providing the base member BM, the operation for forming the injection holes IH, the operation for providing the red organic fluorescent body ROD and the first resin RE1 to the injection holes IH, and the operation for sealing the injection holes 114 may be excluded. Referring to FIGS. 4A and 4B, in this case, an operation for providing the red organic fluorescent body ROD and the first resin RE1 over the entirety of the light source substrate CB and the light source LS and then curing the same to provide the red organic fluorescent layer ODL1, and an operation for providing the green organic fluorescent body GOD and the second resin RE2 over the entirety of the red organic fluorescent body layer ODL1 and the curing the same to provide the green organic fluorescent body layer ODL2 may be included.

In a display device manufactured using the method for manufacturing a display device according to an example embodiment, an organic fluorescent body may be used instead of a quantum dot, and thus the reliability of the display device may be maintained even when a portion of the organic fluorescent body is exposed. Moreover, heavy metals such as Cd and the like may be excluded. Thus, effects (such as that of causing cancer) on the human body may be minimized in the process of using or manufacturing the display device.

By way of summation and review, wavelength conversion members such as fluorescent bodies or quantum dots may be used to enhance the color and color reproduction rate of liquid crystal display devices.

As described above, according to a display device according to an example embodiment, the display quality may be enhanced.

According to a method for manufacturing a display device according to an example embodiment, a display device may be provided in which the display quality may be enhanced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A display device, comprising:
an organic fluorescent body unit; and
a display panel on the organic fluorescent body unit, wherein the organic fluorescent body unit includes:
a light source unit including a light source substrate and a plurality of light sources on the light source substrate,
fluorescent body patterns, each of the red organic fluorescent body patterns including a red organic fluorescent body,
a green organic fluorescent body layer provided on the red organic fluorescent body layer and including a green organic fluorescent body, and
a base member interposed between the green organic fluorescent body layer and the red organic fluorescent body patterns, the base member including:
a top surface contacting the green organic fluorescent body layer, the top surface being flat and continuous over an entirety of the light source substrate, and
a bottom surface opposite the top surface and contacting the light source substrate, the bottom surface including fluorescent body grooves extending from the bottom surface only partially toward the top surface, and each of the red organic fluorescent body patterns being respectively accommodated in one of the fluorescent body grooves,
wherein:
the red organic fluorescent body patterns respectively contact top and side surfaces of each of the light sources, and
the base member is in contact with each of the red organic fluorescent body patterns and separated from each of the light sources by the red organic fluorescent body patterns.

2. The display device as claimed in claim 1, wherein, on a plane, the red organic fluorescent body patterns overlap a portion of the light source substrate.

3. The display device as claimed in claim 1, wherein, on a plane, the red organic fluorescent body patterns are spaced apart from each other.

4. The display device as claimed in claim 1, wherein the fluorescent body grooves are conformal around respective outer surfaces of the red organic fluorescent body patterns.

5. The display device as claimed in claim 4, wherein each of the red organic fluorescent body patterns is enclosed between the light source substrate and a respective fluorescent body groove of the fluorescent body grooves.

6. The display device as claimed in claim 1, wherein the green organic fluorescent body layer is spaced apart from the light source substrate and provided over the entirety of the light source substrate.

7. The display device as claimed in claim 1, wherein the top surface of the base member completely covers all the red organic fluorescent body patterns of the red organic fluorescent body layer.

8. The display device as claimed in claim 1, further comprising a diffusion plate between the green organic fluorescent body layer of the organic fluorescent body unit and the display panel.

9. The display device as claimed in claim 8, further comprising an optical sheet between the diffusion plate and the display panel, the diffusion plate being between the optical sheet and the green organic fluorescent body layer.

10. The display device as claimed in claim 1, wherein the red organic fluorescent body is a perylene-based compound and the green organic fluorescent body is a boron-dipyrromethene-based compound.

11. The display device as claimed in claim 1, wherein light generated by the green organic fluorescent body has a full width at half maximum that is smaller than the full width at half maximum of light generated by the red organic fluorescent body.

12. The display device as claimed in claim 1, wherein the glass transition temperature of the green organic fluorescent body is lower than the glass transition temperature of the red organic fluorescent body.

13. The display device as claimed in claim 1, wherein the light source substrate includes a plurality of sealing parts, each of which is aligned with an edge of a corresponding fluorescent body groove and one of the red fluorescent body patterns.

14. A method for manufacturing a display device, the method comprising:
providing an organic fluorescent body unit; and
providing a display panel on the organic fluorescent body unit, wherein the providing of the organic fluorescent body unit includes:
preparing a base substrate and a plurality of light sources provided on the base substrate;
providing a base member on the base substrate;
providing a red organic fluorescent body layer including a plurality of organic fluorescent body patterns, each of which respectively includes a red organic fluorescent body and contacts top and side surfaces of one of the light sources;
providing a green organic fluorescent body layer on the red organic fluorescent body layer and including a green organic fluorescent body, the base member being interposed between the green organic fluorescent body layer and the red organic fluorescent body patterns,
wherein the base member includes:
a top surface contacting the green organic fluorescent body layer, the top surface being flat and continuous over an entirety of the base substrate, and
a bottom surface opposite the top surface and contacting the base substrate, the bottom surface including fluorescent body grooves extending from the bottom surface only partially toward the top surface, and each of the red organic fluorescent body patterns being respectively accommodated in one of the fluorescent body grooves, and
wherein the base member is in contact with each of the red organic fluorescent body patterns and separated from each of the light sources by the red organic fluorescent body patterns.

15. The method as claimed in claim 14, further comprising:
forming injection holes in the base substrate; and
providing the light sources on the base substrate.

16. The method as claimed in claim 15, wherein, in the providing of the light sources, each of the light sources is provided spaced apart on a plane from the injection holes.

17. The method as claimed in claim 15, wherein the providing of the red organic fluorescent body layer includes injecting the red organic fluorescent body and a first resin into the injection holes to fill the fluorescent body grooves.

18. The method as claimed in claim 17, further comprising sealing the injection holes after the providing of the red organic fluorescent body layer.

* * * * *